(12) United States Patent
Li et al.

(10) Patent No.: US 6,936,547 B2
(45) Date of Patent: Aug. 30, 2005

(54) GAS DELIVERY SYSTEM FOR DEPOSITION PROCESSES, AND METHODS OF USING SAME

(75) Inventors: Weimin Li, Boise, ID (US); Neal R. Rueger, Boise, ID (US); Li Li, Meridian, ID (US); Ross S. Dando, Nampa, ID (US); Kevin T. Hamer, Meridian, ID (US); Allen P. Mardian, Boise, ID (US)

(73) Assignee: Micron Technology, Inc.., Boise, ID (US)

( * ) Notice: Subject to any disclaimer, the term of this patent is extended or adjusted under 35 U.S.C. 154(b) by 25 days.

(21) Appl. No.: 10/284,681

(22) Filed: Oct. 31, 2002

(65) Prior Publication Data

US 2004/0083972 A1 May 6, 2004

(51) Int. Cl.[7] .............................................. H01L 21/31
(52) U.S. Cl. ....................................... 438/758; 438/680
(58) Field of Search .......................................... 438/758

(56) References Cited

U.S. PATENT DOCUMENTS

| | | | | |
|---|---|---|---|---|
| 5,998,303 A | * | 12/1999 | Sato .......................... 438/758 |
| 6,030,667 A | * | 2/2000 | Nakagawa et al. .......... 427/569 |
| 6,110,531 A | * | 8/2000 | Paz de Araujo et al. .... 427/255.25 |
| 6,200,911 B1 | * | 3/2001 | Narwankar et al. ......... 438/758 |
| 6,268,288 B1 | * | 7/2001 | Hautala et al. ............. 438/680 |
| 6,511,718 B1 | * | 1/2003 | Paz de Araujo et al. .... 427/576 |

* cited by examiner

Primary Examiner—John F. Niebling
Assistant Examiner—Olivia Luk
(74) Attorney, Agent, or Firm—Williams, Morgan & Amerson, P.C.

(57) ABSTRACT

The present invention is generally directed to a novel gas delivery system for various deposition processes, and various methods of using same. In one illustrative embodiment, a deposition tool comprises a process chamber, a wafer stage adapted for holding a wafer positioned therein, and a gas delivery system positioned in the chamber above a position where a plasma will be generated in the chamber, wherein substantially all of a reactant gas is delivered into the chamber via the gas delivery system. In another illustrative embodiment, the reactant gas exiting the gas delivery system is directed so as to cover substantially all of an area defined by an upper surface of the wafer. In one illustrative embodiment, the method comprises positioning a wafer in a process chamber of a deposition tool, generating a plasma within the process chamber above the wafer, and forming a layer of material above the wafer by introducing substantially all of a reactant gas used to form the layer of material into the process chamber above the plasma via a gas delivery system positioned above the plasma. In another illustrative embodiment, the reactant gas exiting the gas delivery system is directed to cover substantially all of an area defined by an upper surface of the wafer.

113 Claims, 8 Drawing Sheets

(Prior Art)

(Prior Art)

Figure 4H

GAS DELIVERY SYSTEM FOR DEPOSITION PROCESSES, AND METHODS OF USING SAME

BACKGROUND OF THE INVENTION

1. Field of the Invention

This present invention is generally directed to the field of semiconductor manufacturing, and, more particularly, to a novel gas delivery system for various deposition processes, and various methods of using same.

2. Description of the Related Art

Figure 1A:
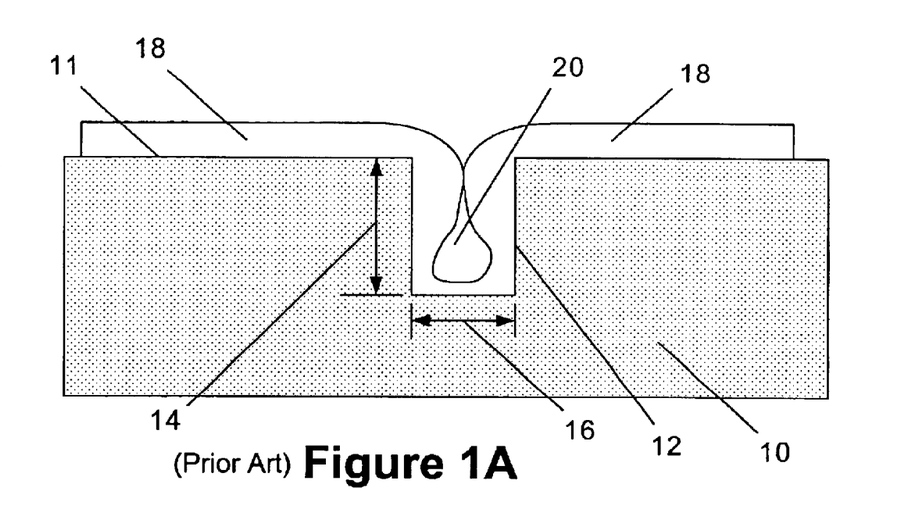
FIGS. 1A–1F depict illustrative embodiments of various prior art deposition tools used to form a process layer and a trench-type structure filled using such equipment.

The manufacturing of integrated circuit products involves, among other things, the formation of layers of a variety of different types of material using a variety of different deposition processes, e.g., chemical vapor deposition (CVD), high density plasma chemical vapor deposition (HDPCVD), low pressure chemical vapor deposition (LPCVD), plasma enhanced chemical vapor deposition (PECVD), etc. In some cases, these layers may be subsequently patterned by performing a variety of known photolithography and etching processes. In other cases, such layers may be formed to fill a previously formed trench-type feature. For example, as shown in FIG. 1A, a trench 12 may be formed in a semiconducting substrate 10 using any of a variety of known etching processes. The trench 12 may be formed in the substrate 10 as part of the process of forming a trench isolation structure that may be used to electrically isolate various integrated circuit components, e.g., memory cells, transistors, etc., from one another. The trench 12 will ultimately be filled with an insulating material, such as silicon dioxide, silicon oxynitride, etc.

As depicted in FIG. 1A, the trench 12 has a depth 14 (beneath the surface 11 of the semiconducting substrate 10) and a width or critical dimension 16. These dimensions may vary, but in current generation technology, the trench 12 may have a relatively high aspect ratio (depth/width) that exceeds approximately 4:1. For example, the trench 12 may have a width 16 of approximately 75 nm and the depth 14 may be approximately 200–600 nm. Simply put, as device dimensions for integrated circuit products have decreased, so have the dimensions of the trench isolation structures. Such reductions in the width 16 of the trench 12 are desirable for conservation of valuable plot space on an integrated circuit device.

Unfortunately, as the aspect ratio of such trenches 12 has increased, it has become more difficult to adequately fill the trench with the appropriate insulating material using existing processing tools and techniques. For example, as shown in FIG. 1A, using existing processing tools, a layer of insulating material 18, e.g., silicon dioxide, may tend to "pinch-off" in the opening of the high aspect ratio trench 12. This results in the formation of an undesirable void 20 in the trench 12. Such a void may reduce the effectiveness of the isolation structure when it is completed.

Figure 1B:
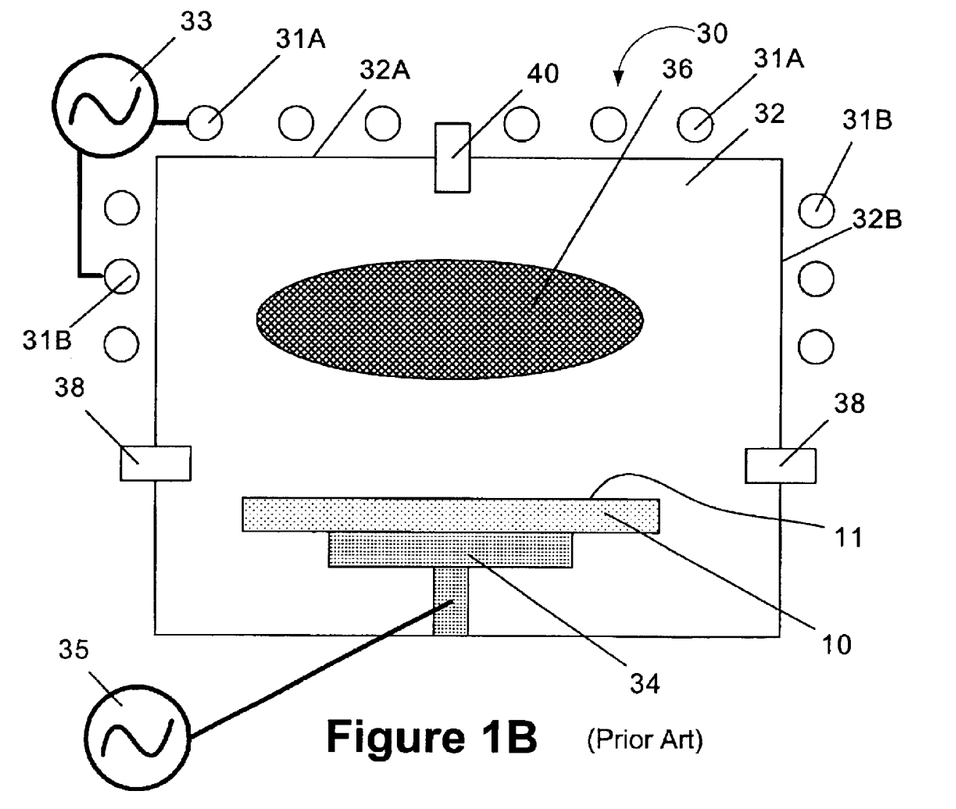

It is believed that this problem is at least partially due to the manner in which the gas delivery systems in modem deposition tools are configured. For example, FIG. 1B is a schematic depiction of an illustrative Applied Materials Ultima Model 5200 deposition tool. As shown therein, the tool 30 is comprised of a process chamber 32 and a wafer stage 34 that is adapted to hold a wafer 10 during the deposition process performed in the tool 30. The deposition tool 30 is also comprised of many additional components, such as a coil 31A positioned adjacent a top surface 32A of the process chamber 32, and a coil 31B positioned adjacent a side surface 32B of the process chamber 32. The coils 31A, 31B may be coupled to one or more RF power supplies 33 (only one of which is shown). An RF power supply 35 is coupled to the wafer stage 34. The tool 30 may also have other components, such as various electrical connections, temperature sensors, pressure sensors, mass-flow controllers, and valving which are well known to those skilled in the relevant art. Such components are not depicted so as not to obscure the present invention.

Figure 1C:
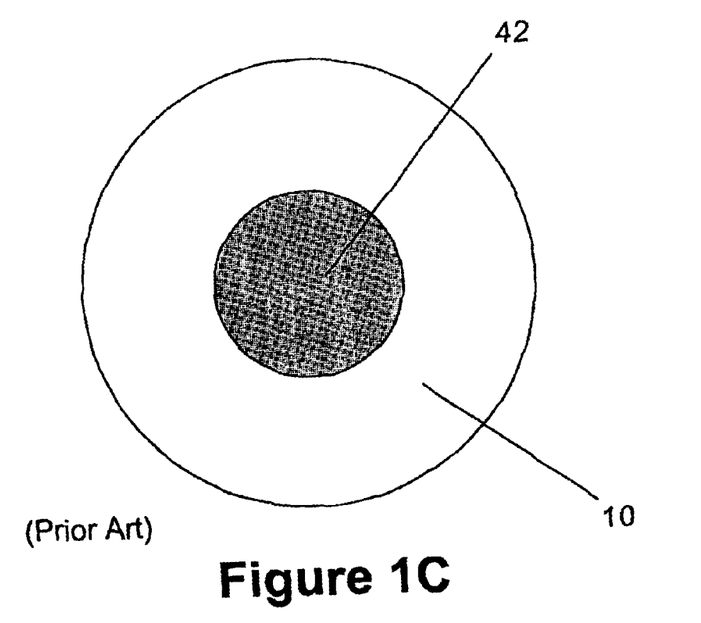

In general, a plasma 36 or glow discharge will be generated in the process chamber 32 by application of RF power to one or both of the coils 31A, 31B. Various reactant gases will be introduced for purposes of forming a layer of material on the wafer 10. For example, in the case of forming a layer of silicon dioxide, silane ($SiH_4$) may be introduced into the process chamber 32. The silane may be mixed with a variety of carrier gases, e.g., hydrogen ($H_2$), nitrogen ($N_2$), argon (Ar), etc. In the Applied Materials tool 30, the vast majority of the process gas is introduced through a plurality of side nozzles 38 that are positioned slightly above the surface 11 of the wafer 10. The exact configuration and number of the side nozzles 38 will vary. For example, in one embodiment, eight groups of three of the side nozzles 38 are spaced around the perimeter of the process chamber 32. Each of the side nozzles 38 typically has an inside diameter of approximately 0.030 inches. Additionally, the Applied Materials tool has a single top nozzle 40 through which a relatively small amount of the total reactant gas flow is introduced into the process chamber 32. For example, the top nozzle 40 may have an inside diameter of approximately 0.030 inches and approximately 10–25% of the total silane gas flow may be introduced into the chamber via the top nozzle 40. As shown in FIG. 1C, the coverage area 42 of the reactant gas from the top nozzle 40 is only approximately 1–30% of the total area of the wafer 10.

Figure 1D:
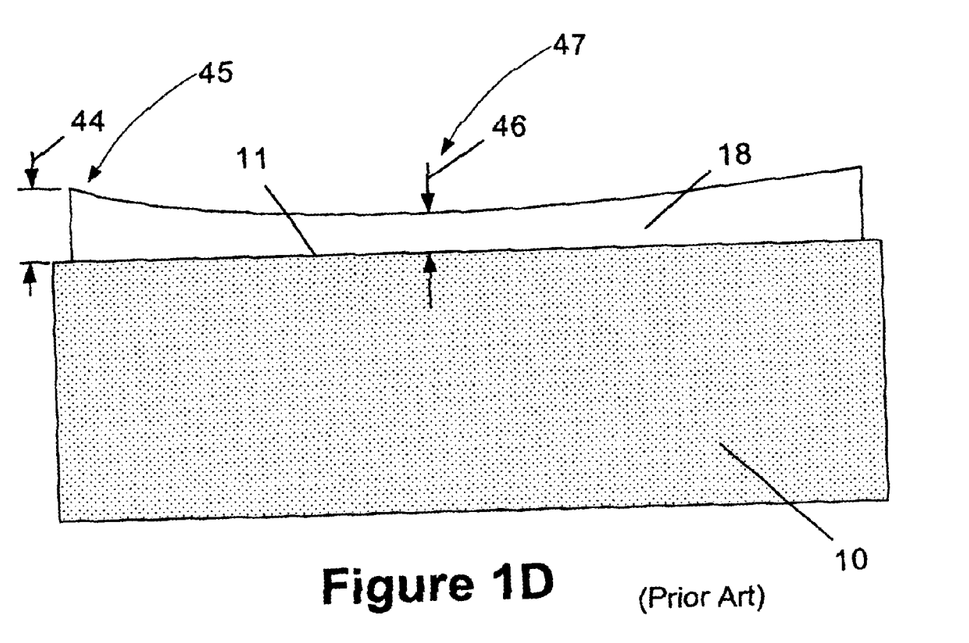
Figure 1E:
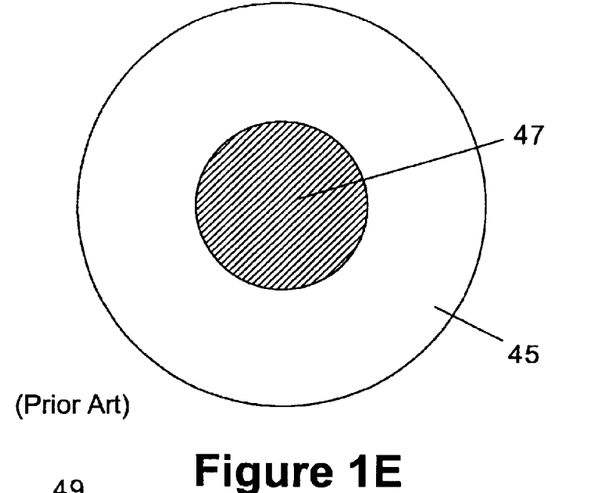

As shown in FIGS. 1D and 1E, using existing gas delivery systems in modern deposition tools, there tends to be a variation in the thickness 44 of the process layer 18 near the edge region 45 of the wafer 10 as compared to the thickness 46 of the process layer 18 near the center region 47 of the wafer 10. This thickness variation may be significant in some situations. For example, the thickness variation may range from approximately 30–100 nm on a film having a target nominal thickness of approximately 300 nm.

Such thickness variations are due to a variety of factors that are believed to include the manner in which reactant gases are supplied to the process chamber 32. More specifically, there are two competing mechanisms involved during the process of forming the process layer 18—sputtering and deposition. In general, the deposition process involves a chemical reaction using the reactant gases supplied to the process chamber 32. Sputtering involves the action whereby ions generated by the plasma impact the layer of material 18 as it is being formed and, simplistically, sputter off portions of that layer 18 causing it to be deposited elsewhere. These processes continue to interact throughout the process of forming the process layer 18.

Unfortunately, due to the gas delivery system for existing process tools, the deposition mechanism tends to dominate in the edge region 45 of the wafer 10 due to the introduction of the majority of the reactant gases via the side nozzles 38. As a result, the sputtering mechanism is not as prevalent at the edge region 45 as would be desired. In some applications, such as the filling of high aspect ratio trenches, a higher sputter-to-deposition ratio is desired. Sputtering is desirable, at least to some extent, because the sputtering process tends to reduce the chances of pinching off the opening of the trench 12, as illustratively depicted in FIG. 1A.

Figure 1F:
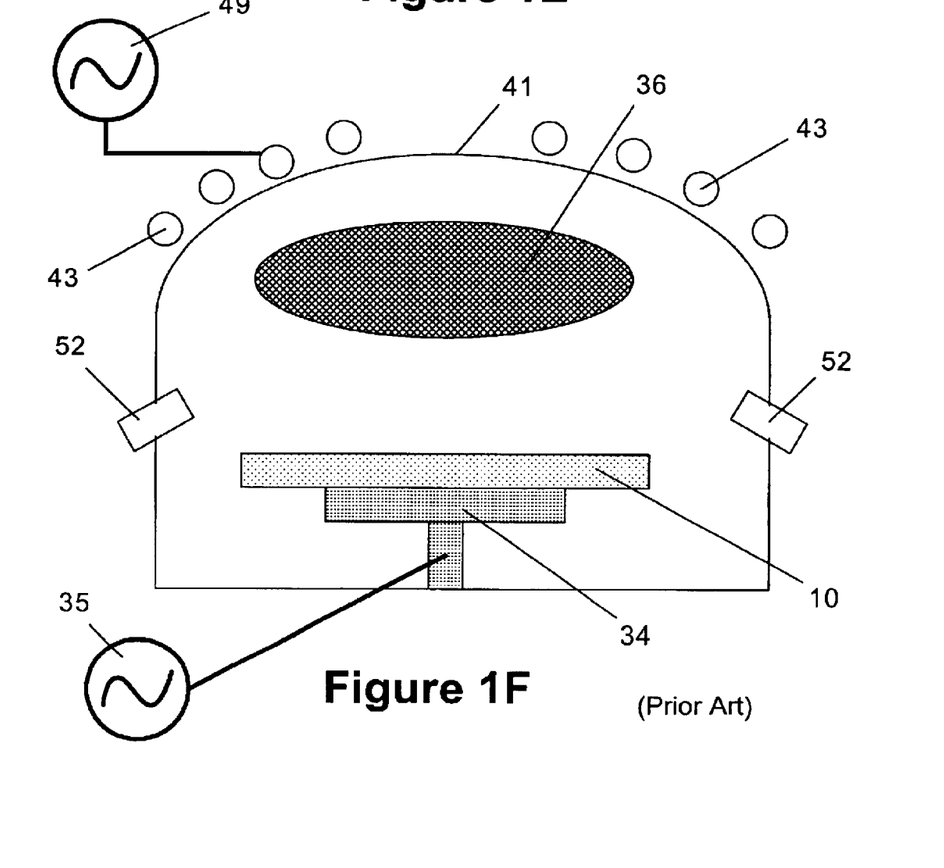

Another prior art deposition tool 50, a Novellus Speed II Model, is depicted in FIG. 1F. As shown therein, the process chamber 32 of that tool has a generally dome-shaped top 41, a coil 43 that is coupled to an RF power supply 49, and it is provided with a plurality of upwardly-directed side nozzles 52. The number of side nozzles 52 may vary. In one illustrative embodiment, 3–50 of such nozzles 52 are spaced around the perimeter of the process chamber 32.

A problem still persists with respect to the ability to reliably and accurately fill trench-type features with high aspect ratios in the course of manufacturing modern integrated circuit devices. The present invention is directed to a method that may solve, or at least reduce, some or all of the aforementioned problems.

SUMMARY OF THE INVENTION

The present invention is generally directed to a novel gas delivery system for various deposition processes, and various methods of using same. The gas delivery system may take various forms. In one illustrative embodiment, a deposition tool comprises a process chamber with a top surface and an RF coil positioned adjacent the top surface of the chamber, wherein the chamber is adapted to have a plasma generated therein, the plasma having a region wherein highest ionization occurs, a wafer stage adapted for holding a wafer positioned thereon, and a gas delivery system positioned in the chamber adjacent the top surface of the chamber, the region of highest ionization of the plasma being located between the gas delivery system and at least one process gas outlet of the chamber, wherein substantially all of a reactant gas used in forming a process layer on the wafer is delivered into the chamber via the gas delivery system. In another embodiment, the gas delivery system is positioned in the chamber adjacent the top surface of the chamber above a position where a plasma will be generated in the chamber and the reactant gas exiting the gas delivery system is directed so as to cover substantially all of an area defined by an upper surface of the wafer.

In one illustrative embodiment, the method comprises positioning a wafer in a process chamber of a deposition tool, the chamber having a top surface and an RF coil positioned adjacent the top surface, generating a plasma within the process chamber above the wafer, the plasma having a region wherein highest ionization occurs, and forming a layer of material above the wafer by introducing substantially all of a reactant gas used to form the layer of material into the region of highest ionization via a gas delivery system positioned adjacent the top surface of the chamber above the plasma. In another embodiment, the method comprises introducing a reactant gas used to form the layer of material into the process chamber above the plasma via the gas delivery such that the reactant gas exiting the gas delivery system is directed to cover substantially all of an area defined by an upper surface of the wafer.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
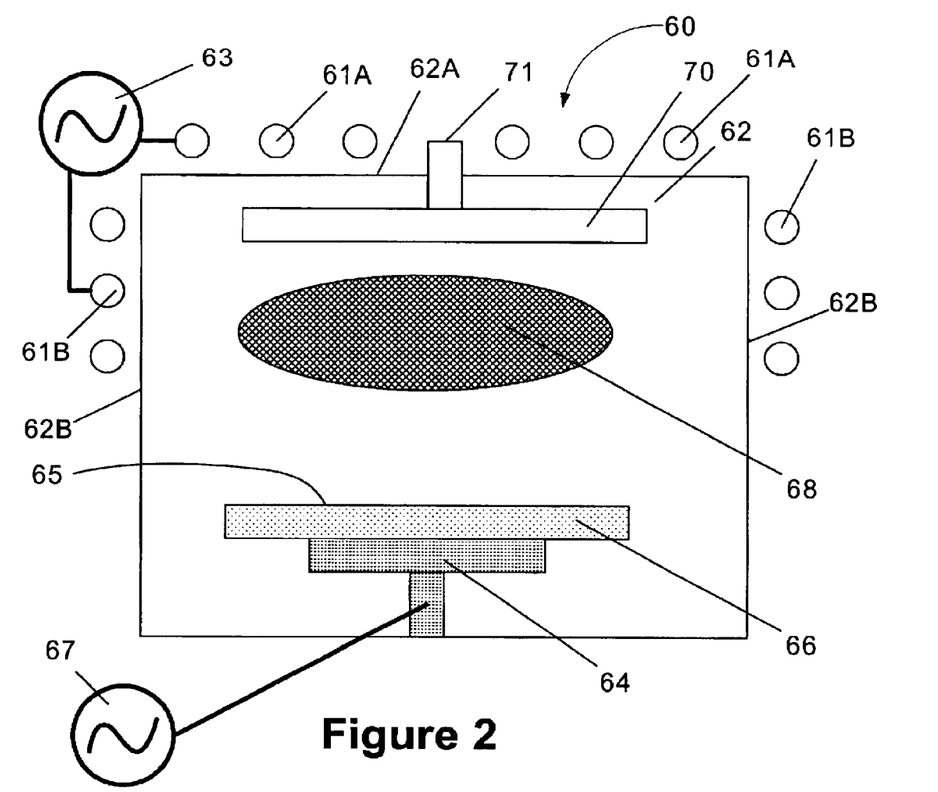
FIG. 2 is a schematic depiction of a deposition tool in accordance with one illustrative embodiment of the present invention.

FIG. 2 is a schematic depiction of a deposition tool 60 in accordance with one illustrative embodiment of the present invention. As shown therein, the tool 60 is comprised of a process chamber 62, a wafer stage 64 coupled to an RF power supply 67 and a gas delivery system 70. The gas delivery system 70 is positioned adjacent a top surface 62A of the chamber. A wafer 66 is positioned above the wafer stage 64. The tool 60 further comprises a coil 61A positioned adjacent the top surface 62A of the process chamber 32, and a coil 61B positioned adjacent a side surface 62B of the process chamber 62. The coils 61A, 61B are coupled to one or more schematically depicted RF power sources 63. Various other components of the tool 60, e.g., temperature and pressure sensors, mass-flow controllers, etc., are well known to those skilled in the art and, thus, are not depicted so as to not obscure the present invention.

The tool 60 may be used to generate a plasma 68 that is schematically depicted in the drawing. A plasma is generally defined as a gas containing an equal number of positive and negative charges as well as some number of neutral gas particles. A glow discharge is a self-sustaining type of plasma. As used herein, the term plasma should be understood to include any type of plasma or glow discharge. As will be recognized by those skilled in the relevant art after a complete reading of the present application, the present invention may be employed using a variety of different types of deposition processes, such as, for example, an HDPCVD process. Moreover, the present invention may be employed in forming a variety of different types of material, such as silicon dioxide, silicon oxynitride, etc. Thus, the present invention should not be considered as limited to any particular type of deposition process or to the formation of any particular type of material unless such limitations are expressly set forth in the appended claims.

In operation, one or more reactant gases will be introduced into the process chamber 62 via the gas delivery system 70, which is schematically depicted in FIG. 2. The reactant gases, e.g., silane ($SiH_4$) may be mixed with a carrier gas, such as hydrogen ($H_2$), nitrogen ($N_2$), argon (Ar), etc. Other reactant gases may be employed with the present invention. In this manner, substantially all of the reactant gases used to form a layer of material (not shown) above the wafer 66 are introduced into the plasma region 68 from above. More specifically, the gas delivery system 70 of the present invention is provided in such a manner that the highest ionization region of the plasma glow is between the location where substantially all of the process gases enter the process chamber and the location where the gases exit the chamber. As a result, a very large percentage of the reactant gases have the opportunity to be ionized by the plasma 68. In turn, this aids in assuring that the sputtering mechanism will be actively used in forming the layer of material above the wafer 66. By ionizing substantially all of the reactant gas introduced into the process chamber 32, a more uniform layer of material may be formed above the wafer 66.

Figure 3:
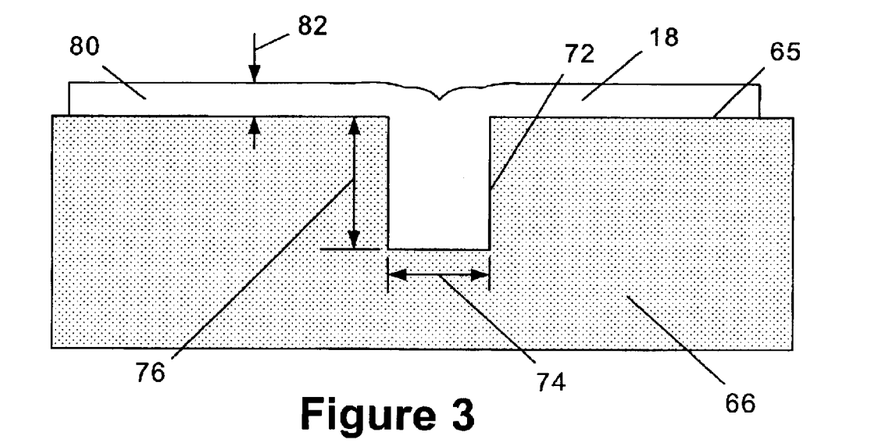
FIG. 3 is a cross-sectional view of a wafer having a trench formed therein where a process layer is formed in the trench and above the wafer using the techniques described in the present invention.

Even more specifically, by introducing substantially all of the reactant gases into the process chamber 62 via the gas delivery system 70, the deposition tool may be used to reliably fill a high aspect ratio trench 72 formed in the wafer 66, as shown in FIG. 3. For example, the present invention has been successfully employed in performing a high density plasma chemical vapor deposition (HDPCVD) to deposit a layer of silicon dioxide into the trench 72 wherein the trench 72 had a width 74 of approximately 70 nm and a depth of approximately 250 nm, i.e., an aspect ratio of approximately 3.5. During this process, approximately 68 sccm of silane ($SiH_4$) was introduced into the process chamber 62 via the top gas delivery system 70 using a carrier gas comprised of argon (Ar). When the process was completed, the process layer 80 had a nominal thickness 82 of approximately 310 nm. The material in the trench 72 had little or no voids.

The structure of the gas delivery system 70 may vary. The gas delivery system 70 is positioned adjacent the top surface 62A of the process chamber 62, and it has a gas inlet 71 that is coupled to or extends through the top surface 62A. However, whatever design the gas delivery system 70 takes, it should be constructed and configured in such a manner that the reactant gases leaving the gas delivery system 70 are introduced in such a manner that the ionized gases will cover substantially all of an area defined by the upper surface 65 of the wafer 66. That is, unlike the top nozzle 40 depicted in FIG. 1B, which covered only approximately 10% of the area defined by the wafer surface, the gas delivery system 70 of the present invention may be configured so as to cover substantially all of the area defined by the upper surface 65 of the wafer 66. For example, in one illustrative embodiment, the reactant gas preferably covers at least 90% of the area defined by the upper surface 65 of the wafer 66.

Various illustrative embodiments of the gas delivery system 70 will now be described with reference to FIGS. 4A–4H. In all cases, the gas delivery system 70 is designed such that the highest ionization region of the plasma 68 is positioned between the inlet where substantially all of the reactant gases are directed into the chamber and the outlet where the process gases exit the chamber. As a result, a large percentage of the gas molecules have a good chance of being ionized.

Figures 4A, 4B:
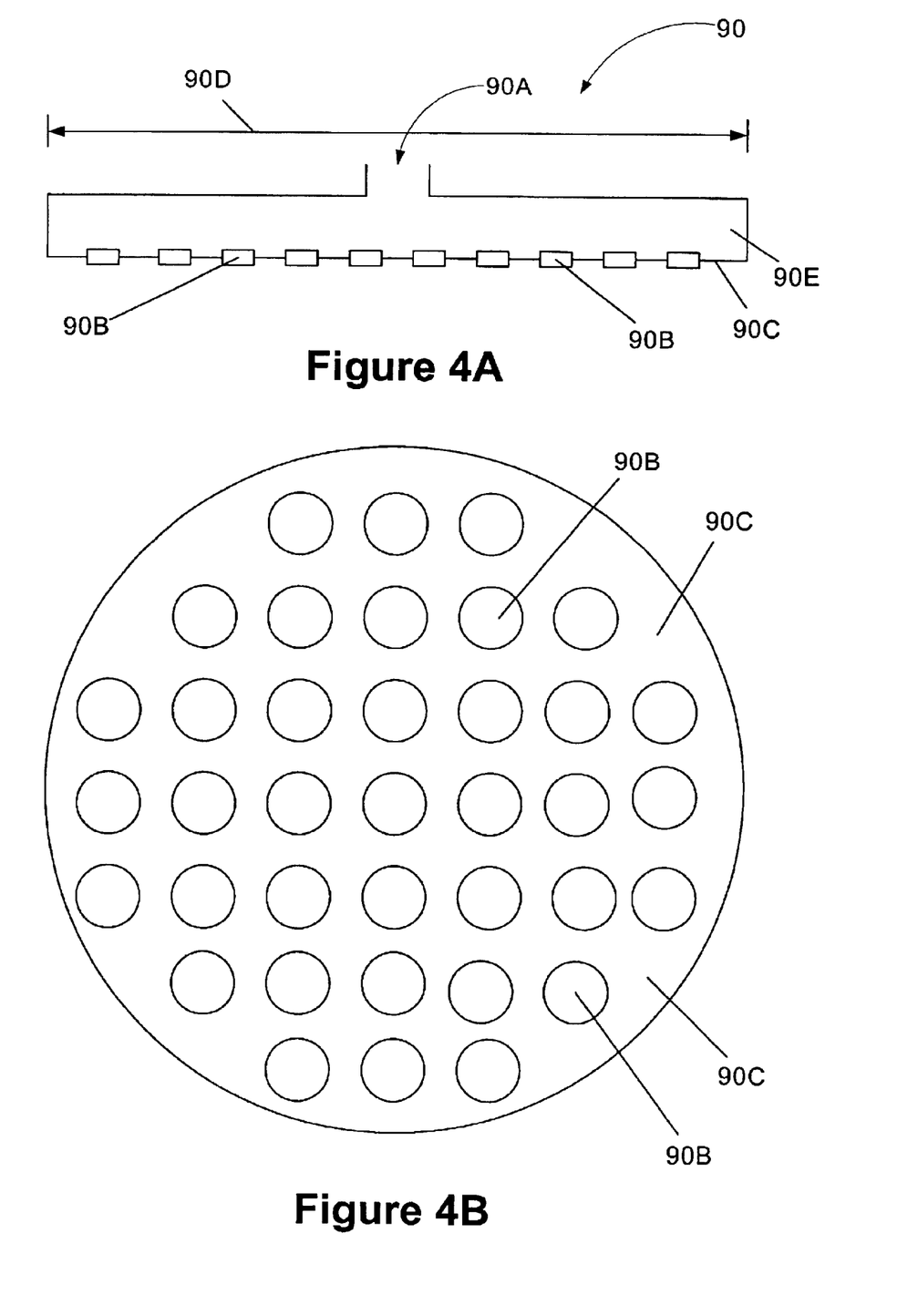
FIGS. 4A–4H depict various illustrative embodiments of a gas delivery system in accordance with the present invention.

For example, as shown in FIGS. 4A–4B, the gas delivery system 70 may take the form of a showerhead outlet 90. FIGS. 4A and 4B are, respectively, a side view and a bottom view of the showerhead outlet 90. The showerhead outlet 90 has a body 90E, an inlet 90A and a plurality of outlets 90B formed in the bottom surface 90C of the body 90E. The inlet 90A of the gas delivery system 70 is coupled to and extends through the top surface 62A of the chamber 62. The size and configuration of the inlet 90A may vary depending upon a variety of factors, such as the anticipated gas flow rate, various heat transfer characteristics, the physical structure of the deposition tool itself, etc. In fact, if desired or deemed appropriate, the showerhead outlet 90 may have more than one inlet 90A. Additionally, internal baffling (not shown) may be provided within the showerhead outlet 90 to direct the flow of gas from the inlet nozzle 90A to the various outlets 90B. The number, size, shape and positioning of the outlets 90B may also vary depending upon the particular application. For example, the outlets 90B may have a diameter of approximately 0.030 inches. In one illustrative embodiment where the showerhead outlet 90 is intended for use with 8-inch diameter wafers 66, the showerhead outlet 90 may have a diameter 90D of approximately 9 inches. For 12-inch diameter wafers 66, the diameter 90D may be approximately 13 inches.

Figure 4C:
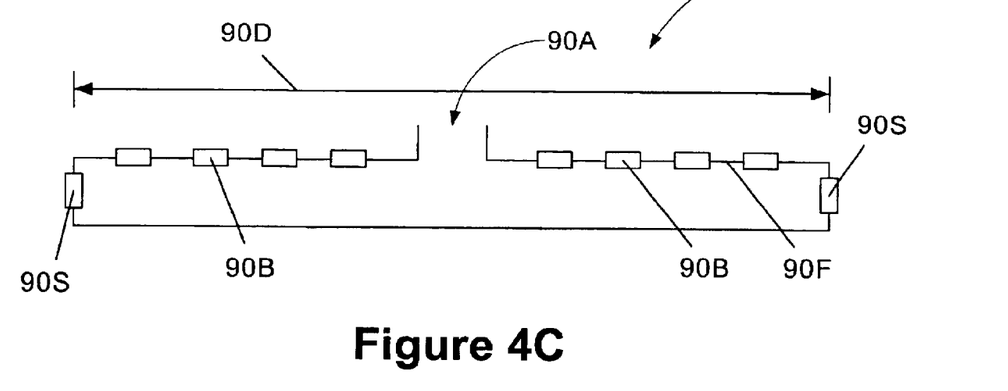
Figure 4D:
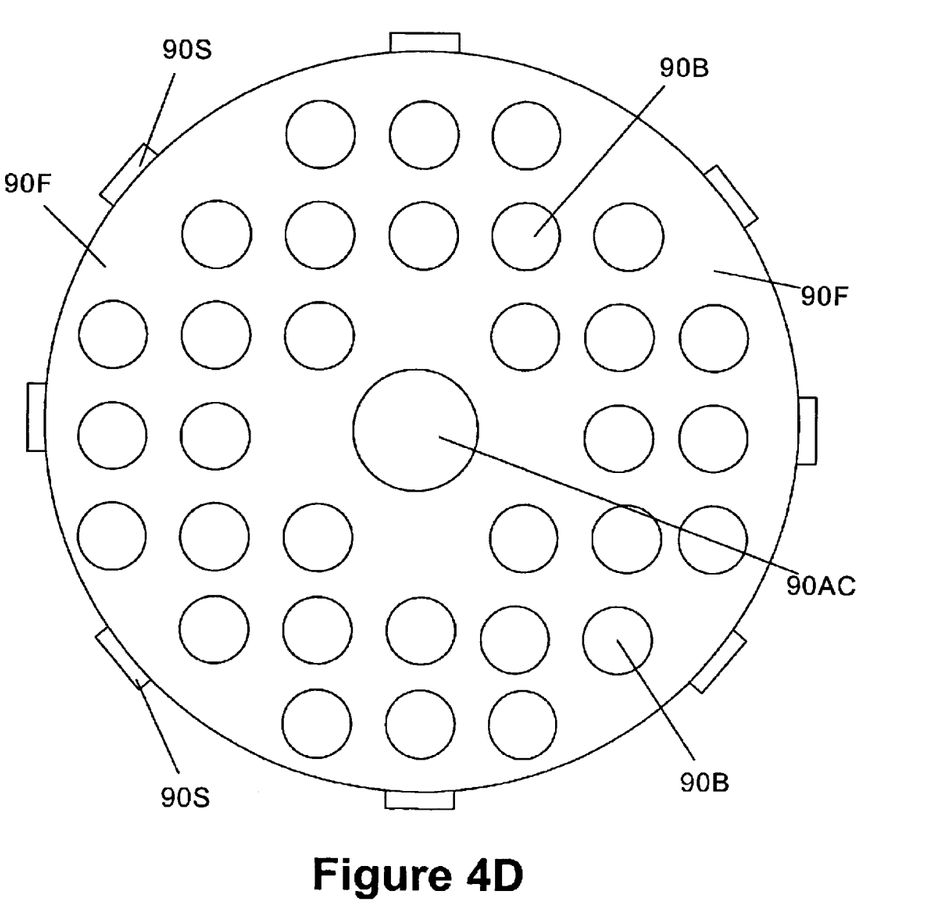

FIGS. 4C–4D depict yet another illustrative embodiment of the showerhead outlet 90. In this embodiment, the outlets 90B are formed in the top surface 90F of the showerhead outlet 90. As with the previous embodiment, the size, number and spacing of the outlets 90B in the embodiment depicted in FIGS. 4C–4D may be varied. The showerhead outlet 90 may also have a plurality of side outlets 90S formed around the periphery of the showerhead outlet 90 as shown in FIGS. 4C–4D. The size, number and positioning of the side outlets 90S may also vary. Moreover, it should be understood that the showerhead outlet 90 may be provided with any combination of outlets in the top surface 90F and/or bottom surface 90C and/or the side outlets 90S. Thus, the particular configuration of the showerhead outlet 90 depicted in the attached drawings should not be considered a limitation of the present invention unless such limitations are clearly set forth in the appended claims.

Figure 4E:
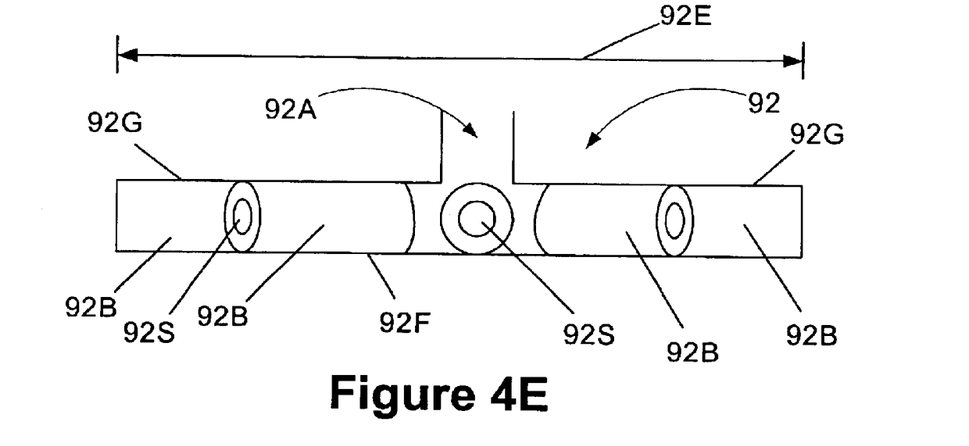
Figure 4F:
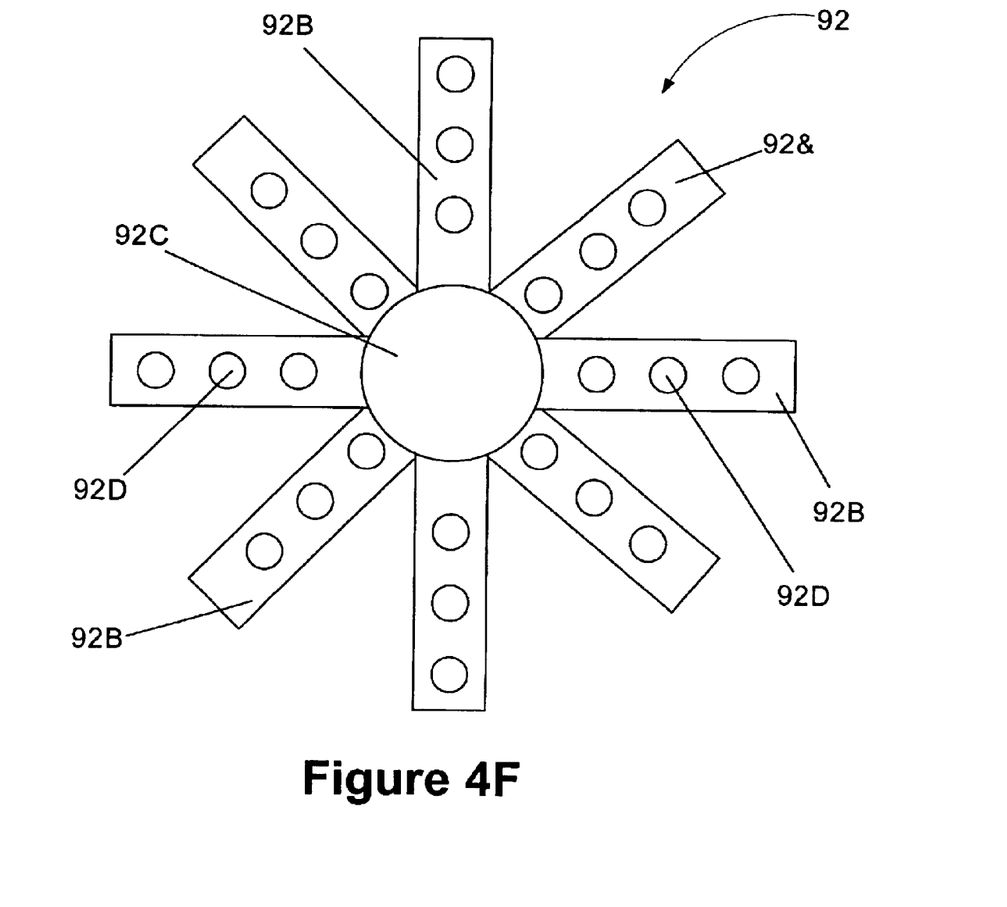

FIGS. 4E–4F are, respectively, a side view and a bottom view of another illustrative embodiment of the gas delivery system 70 comprised of a distributed piping system 92. As can be seen from the drawings, the distributed piping system 92 is comprised of a gas inlet 92A, a plurality of outwardly extending distribution pipes 92B that are coupled to a distribution hub 92C. Each of the distribution pipes 92B may have a plurality of openings 92D formed therein. The openings 92D are not shown in FIG. 4E. The distribution pipes 92 may also have a plurality of side openings 92S (see FIG. 4E). The openings 92D in adjacent distribution pipes 92B may be radially offset from the openings 92D on adjacent distribution pipes 92B, as shown in FIG. 4F. In the depicted embodiment shown in FIGS. 4E–4F, the openings 92D are formed in the bottom side 92F of the distribution pipes 92B. As with the showerhead outlets 90 depicted previously, the openings in the distribution pipes 92B may also be formed in the top side 92G of the distribution pipes 92B. Moreover, as with the showerhead outlet 90, the distributed piping system 92 may be provided with the openings formed on both the top side 92G and the bottom side 92F of the distribution pipes 92B. As with the previous embodiment, the size, number and positioning of the distribution pipes 92B, and the openings 92D formed therein, may vary depending upon the particular application. For example, the distribution pipes 92B may have a nominal diameter of approximately 4 inches, and the openings 92D may have a diameter of approximately 0.030 inches. In one embodiment, approximately 8–12 of the openings 92D are formed on each distribution pipe 92B. As with the previous embodiment, the distribution pipes 92B will be sized to insure that substantially all of the wafer surface 65 is covered by gas from the distributed piping system 92. That is, the distributed piping system 92 may have a diameter 92E of approximately 9 inches or 13 inches for use with wafers 66 having a diameter of approximately 8 and 12 inches, respectively. If the openings 92D are formed in the top surface 92G of the distribution pipes, the overall size or diameter of the distributed piping system 92 may be decreased.

Figure 4G:
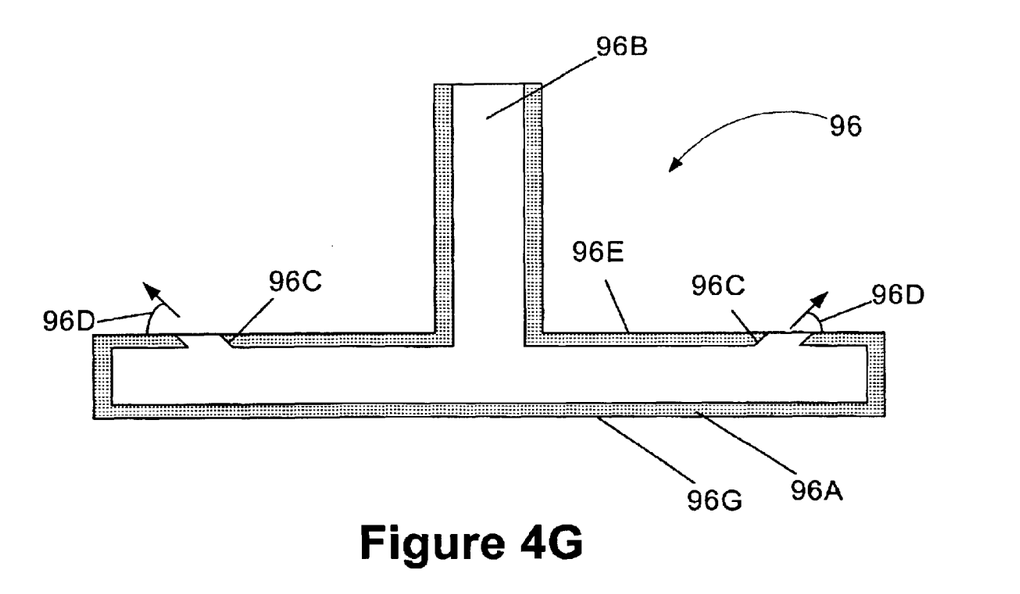
Figure 4H:
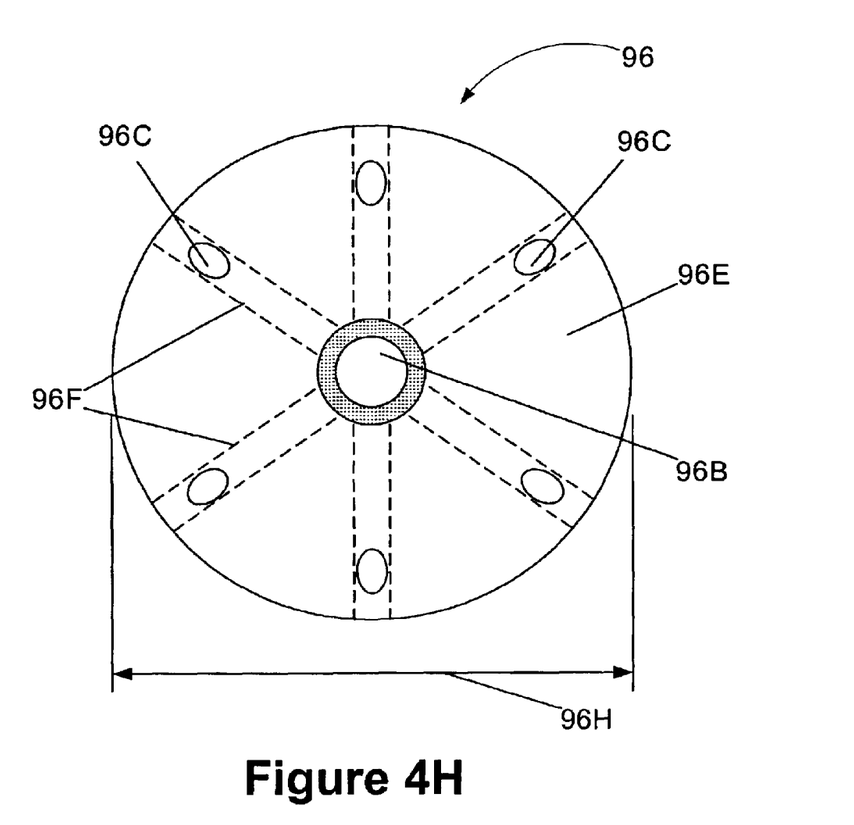

FIGS. 4G–4H depict yet another illustrative embodiment of a gas distribution system 96. As shown therein, the gas distribution system 96 has a disk-like body 96A, a gas inlet 96B, a plurality of outlets 96C, a top surface 96E and a bottom surface 96G. In one illustrative embodiment, the gas distribution system 96 has a diameter 96H of approximately 3½ inches. In the depicted embodiment, six outlets 96C are formed in the top surface 96E of the body 96A. A plurality of internal baffles 96F are provided in the body 96A to direct the flow of gas from the gas inlet 96B to the outlets 96C. The outlets 96C have a diameter of approximately 0.015–0.045 inches and they are formed in the top surface 96E at an angle 96D of approximately 45 degrees. In the embodiment depicted in FIGS. 4G–4H, the gas distribution system 96 has an overall diameter of approximately 3½ inches and the outlets 96C are directed upward in an effort to insure more complete coverage of the wafer. In other embodiments where the gas outlets are directed downward toward the wafer, it is believed that the pattern of the outlets needs to somewhat approximate the diameter of the wafer to insure better coverage of the underlying wafer.

As thus described, a process chamber 62 in accordance with the present invention is provided with a gas delivery system 70 positioned adjacent the top surface 62A of the chamber 62 wherein the highest ionization region of the plasma 68 is between where gas enters the chamber 62 and where gas leaves the chamber (via an evacuation pump). Introducing the gas in this manner will maximize the possibility that each gas molecule will flow through the highest ionization region of the plasma 68. As a result, ionization of a greater number of gas molecules, and in some cases substantially all of the gas molecules, may be accomplished. Moreover, the present invention is comprised of means for introducing a reactant gas into a process chamber wherein the reactant gas leaving the means covers substantially all of the area defined by the surface of the wafer. In one embodiment, the means in both cases is comprised of the showerhead assembly 90 depicted in FIGS. 4A–4D comprised of at least one gas inlet 90A, a body 90, and at least one gas outlet 90B. In another embodiment, the means comprises the distributed piping system 92 depicted in FIGS. 4E–4F comprised of a plurality of distribution pipes 92B having a plurality of openings 92D, 92S formed therein. In a further embodiment, the means is comprised of the gas distribution system 96 depicted in FIGS. 4G–4H including the outlets 96C, the inlet 96B and the body 96A.

Various tests have been performed that demonstrate the superiority of the present invention. For example, a plurality of high aspect ratio trenches were formed in a substrate. The trenches had a width of approximately 70 nm and a depth of approximately 250 nm. The Applied Materials tool 30 described in the background section of this application (see FIG. 1B) was then used in an effort to form a layer of silicon dioxide, using silane as the reactant gas, that would successfully fill the trenches formed in the wafer. During this process, approximately 80% of the reactant gas was introduced into the chamber 32 via the side nozzles 38, and approximately 20% of the reactant gas was introduced into the chamber 38 via the top nozzle 40.

Thereafter, a gas delivery system 70, like that depicted in FIGS. 4G–4H, replaced the top nozzle 40 of Applied Materials tool 30. Another process was performed in an effort to fill a plurality of the high aspect ratio trenches formed across another wafer. During this process, all of the reactant gas, silane, was introduced into the process chamber 38 via the gas delivery system 70 shown in FIGS. 4G–4H. No reactant gases were introduced via the side nozzles 38 shown in FIG. 1A.

By performing the deposition process with the top gas delivery system 70 of the present invention, the high aspect ratio trenches were more readily filled. This was especially true for the trenches near the edge region of the wafer. Through use of the processed described herein, trenches having very small critical dimensions were more readily filled as compared to attempts to fill such trenches using the prior art system depicted in FIG. 1B. More specifically, various tests were performed wherein a plurality of trenches were formed near an edge region of a wafer, wherein each of the trenches had a critical dimension that varied from that of the other trenches. For example, a plurality of trenches were formed in a test substrate with an approximate depth of about 200 nm (2000 Å) and the critical dimensions varied from 0.077 $\mu$m, 0.0765 $\mu$m, 0.0745 $\mu$m and 0.073 $\mu$m, etc. The prior art deposition system depicted in FIG. 1B was used to fill such trenches formed in a test substrate. The nozzle system depicted in FIGS. 4G–4H was then installed, and the processes described herein were performed to fill another set of trenches formed in another test substrate.

The trenches formed by both techniques were then inspected by an RDA inspection process. The results indicated that voids were readily visible for a trench having a critical dimension of approximately 0.0745 $\mu$m formed using the prior art system and methodologies depicted in FIG. 1B. In contrast, by using the system and methods disclosed herein, trenches having a critical dimension as low as 0.073 $\mu$m were reliably filled without producing unacceptable voids in the resulting trench. Thus, the present invention provides identifiable and proven benefits as compared to the prior art systems and methods as depicted and described with reference to FIG. 1B.

The present invention is generally directed to novel gas delivery systems for various deposition processes, and various methods of using same. The gas delivery system may take many forms. In one illustrative embodiment, a deposition tool comprises a process chamber having a top surface and an RF coil positioned adjacent the top surface, the chamber adapted to have a plasma generated therein, the plasma having a region wherein highest ionization occurs, a wafer stage adapted for holding a wafer positioned thereon, and a gas delivery system positioned in the chamber adjacent the top surface of the chamber, the region of highest ionization of the plasma being located between the gas delivery system and at least one process gas outlet of the chamber, wherein substantially all of a reactant gas used in forming a process layer on the wafer is delivered into the chamber via the gas delivery system. In another embodiment, the gas delivery system is configured such that reactant gas exiting the gas delivery system is directed so as to cover substantially all of an area defined by an upper surface of the wafer.

In one illustrative embodiment, the method comprises positioning a wafer in a process chamber of a deposition tool, the chamber having a top surface and an RF coil positioned adjacent the top surface, generating a plasma within the process chamber above the wafer, the plasma having a region wherein highest ionization occurs, and forming a layer of material above the wafer by introducing substantially all of a reactant gas used to form the layer of material into the region of highest ionization via a gas delivery system positioned adjacent the top surface of the chamber above the plasma. In another embodiment, the method comprises introducing a reactant gas used to form the layer of material into the process chamber above the plasma via the gas delivery system, wherein the reactant gas exiting the gas delivery system is directed to cover substantially all of an area defined by an upper surface of the wafer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A deposition tool, comprising:
   a process chamber, said chamber having a top surface and an RF coil positioned adjacent said top surface, said chamber adapted to have a plasma generated therein, said plasma having a region wherein highest ionization occurs;
   a wafer stage adapted for holding a wafer positioned thereon; and
   a gas delivery system positioned in said chamber adjacent said top surface, said region of highest ionization of said plasma being located between said gas delivery system and at least one process gas outlet of said chamber, wherein substantially all of a reactant gas used in forming a process layer on said wafer is introduced into said region of highest ionization of said plasma from above said plasma via said gas delivery system.

2. The deposition tool of claim 1, wherein said gas delivery system is comprised of a structure having at least one gas inlet and a plurality of gas outlets.

3. The deposition tool of claim 1, wherein reactant gas exiting said gas delivery system is directed so as to cover substantially all of an area defined by an upper surface of said wafer.

4. The deposition tool of claim 1, wherein said reactant gas exiting said gas delivery system is directed toward said top surface of said process chamber.

5. The deposition tool of claim 1, wherein said gas delivery system is comprised of a generally circular body having a diameter that is at least approximately the same as a diameter of said wafer, at least one inlet nozzle, and a plurality of outlet nozzles formed in a bottom surface of said generally circular body.

6. The deposition tool of claim 1, wherein said gas delivery system is comprised of a generally circular body and a plurality of outlet nozzles formed in a top surface of said body.

7. The deposition tool of claim 1, wherein said gas delivery system is comprised of a generally circular body and a plurality of outlet nozzles formed in a side surface of said body.

8. The deposition tool of claim 1, wherein said gas delivery system is comprised of a body having a plurality of angled outlets formed in an upper surface of said body.

9. The deposition tool of claim 8, wherein said angled openings are positioned at an angle of approximately 45 degrees with respect to said upper surface of said body.

10. The deposition tool of claim 1, wherein said gas delivery system is comprised of a manifold and a plurality of distribution pipes coupled to said manifold, each of said distribution pipes having a plurality of openings formed therein.

11. The deposition tool of claim 1, wherein said deposition tool is adapted to form a process layer to fill a plurality of trenches formed in said wafer.

12. The deposition tool of claim 1, further comprising an RF coil positioned adjacent a side surface of said chamber.

13. The deposition tool of claim 1, wherein said gas delivery system has a gas inlet that extends through said top surface of said chamber.

14. The deposition tool of claim 1, wherein said gas delivery system has an inlet that is coupled to said top surface of said chamber.

15. A deposition tool, comprising:
   a process chamber, said chamber having a top surface and an RF coil positioned adjacent said top surface;
   a wafer stage adapted for holding a wafer positioned thereon; and
   a gas delivery system positioned in said chamber adjacent said top surface above a position where a plasma will be generated in said chamber, wherein substantially all of a reactant gas is introduced into said plasma from above said plasma via said gas delivery system.

16. The deposition tool of claim 15, wherein said gas delivery system is comprised of a structure having at least one gas inlet and a plurality of gas outlets.

17. The deposition tool of claim 15, wherein reactant gas exiting said gas delivery system is directed so as to cover substantially all of an area defined by an upper surface of said wafer.

18. The deposition tool of claim 15, wherein said reactant gas exiting said gas delivery system is directed toward said top surface of said process chamber.

19. The deposition tool of claim 15, wherein said gas delivery system is comprised of a generally circular body having a diameter that is at least approximately the same as a diameter of said wafer, at least one inlet nozzle, and a plurality of outlet nozzles formed in a bottom surface of said generally circular body.

20. The deposition tool of claim 15, wherein said gas delivery system is comprised of a generally circular body and a plurality of outlet nozzles formed in a top surface of said body.

21. The deposition tool of claim 15, wherein said gas delivery system is comprised of a generally circular body and a plurality of outlet nozzles formed in a side surface of said body.

22. The deposition tool of claim 15, wherein said gas delivery system is comprised of a body having a plurality of angled outlets formed in an upper surface of said body.

23. The deposition tool of claim 22, wherein said angled openings are positioned at an angle of approximately 45 degrees with respect to said upper surface of said body.

24. The deposition tool of claim 15, wherein said gas delivery system is comprised of a manifold and a plurality of distribution pipes coupled to said manifold, each of said distribution pipes having a plurality of openings formed therein.

25. The deposition tool of claim 15, wherein said deposition tool is adapted to form a process layer to fill a plurality of trenches formed in said wafer.

26. The deposition tool of claim 15, further comprising an RF coil positioned adjacent a side surface of said chamber.

27. The deposition tool of claim 15, wherein said gas delivery system has a gas inlet that extends through said top surface of said chamber.

28. The deposition tool of claim 15, wherein said gas delivery system has an inlet that is coupled to said top surface of said chamber.

29. A deposition tool, comprising:
a process chamber, said chamber having a top surface and an RF coil positioned adjacent said top surface;
a wafer stage adapted for holding a wafer positioned thereon; and
a gas delivery system positioned in said chamber adjacent said top surface above a position where a plasma will be generated in said chamber, wherein reactant gas exiting said gas delivery system is directed so as to cover substantially all of an area defined by an upper surface of said wafer;
wherein said gas delivery system is adapted to introduce substantially all of said reactant gas into said plasma from above said plasma.

30. The deposition tool of claim 29, wherein said gas delivery system is comprised of a structure having at least one gas inlet and a plurality of gas outlets.

31. The deposition tool of claim 29, wherein said reactant gas exiting said gas delivery system is directed toward said top surface of said process chamber.

32. The deposition tool of claim 29, wherein said gas delivery system is comprised of a generally circular body having a diameter that is at least approximately the same as a diameter of said wafer, at least one inlet nozzle, and a plurality of outlet nozzles formed in a bottom surface of said generally circular body.

33. The deposition tool of claim 29, wherein said gas delivery system is comprised of a generally circular body and a plurality of outlet nozzles formed in a top surface of said body.

34. The deposition tool of claim 29, wherein said gas delivery system is comprised of a generally circular body and a plurality of outlet nozzles formed in a side surface of said body.

35. The deposition tool of claim 29, wherein said gas delivery system is comprised of a body having a plurality of angled outlets formed in an upper surface of said body.

36. The deposition tool of claim 35, wherein said angled openings are positioned at an angle of approximately 45 degrees with respect to said upper surface of said body.

37. The deposition tool of claim 29, wherein said gas delivery system is comprised of a manifold and a plurality of distribution pipes coupled to said manifold, each of said distribution pipes having a plurality of openings formed therein.

38. The deposition tool of claim 29, wherein said deposition tool is adapted to form a process layer to fill a plurality of trenches formed in said wafer.

39. The deposition tool of claim 29, further comprising an RF coil positioned adjacent a side surface of said chamber.

40. The deposition tool of claim 29, wherein said gas delivery system has a gas inlet that extends through said top surface of said chamber.

41. The deposition tool of claim 29, wherein said gas delivery system has an inlet that is coupled to said top surface of said chamber.

42. A deposition tool, comprising:
a process chamber, said chamber having a top surface and an RF coil positioned adjacent said top surface;
a wafer stage adapted for holding a wafer positioned thereon; and
a gas delivery system positioned in said chamber adjacent said top surface above a position where a plasma will be generated in said chamber, wherein substantially all of a reactant gas is introduced into said plasma from above said plasma via said gas delivery system, and wherein reactant gas exiting said gas delivery system is directed so as to cover substantially all of an area defined by an upper surface of said wafer.

43. The deposition tool of claim 42, wherein said gas delivery system is comprised of a structure having at least one gas inlet and a plurality of gas outlets.

44. The deposition tool of claim 42, wherein said reactant gas exiting said gas delivery system is directed toward said top surface of said process chamber.

45. The deposition tool of claim 42, wherein said gas delivery system is comprised of a generally circular body having a diameter that is at least approximately the same as a diameter of said wafer, at least one inlet nozzle, and a plurality of outlet nozzles formed in a bottom surface of said generally circular body.

46. The deposition tool of claim 42, wherein said gas delivery system is comprised of a generally circular body and a plurality of outlet nozzles formed in a top surface of said body.

47. The deposition tool of claim 42, wherein said gas delivery system is comprised of a generally circular body and a plurality of outlet nozzles formed in a side surface of said body.

48. The deposition tool of claim 42, wherein said gas delivery system is comprised of a body having a plurality of angled outlets formed in an upper surface of said body.

49. The deposition tool of claim 48, wherein said angled openings are positioned at an angle of approximately 45 degrees with respect to said upper surface of said body.

50. The deposition tool of claim 42, wherein said gas delivery system is comprised of a manifold and a plurality of distribution pipes coupled to said manifold, each of said distribution pipes having a plurality of openings formed therein.

51. The deposition tool of claim 42, wherein said deposition tool is adapted to form a process layer to fill a plurality of trenches formed in said wafer.

52. A deposition tool, comprising:
a process chamber having a top surface and an RF coil positioned adjacent said top surface, said chamber adapted to have a plasma generated therein, said plasma having a region wherein highest ionization occurs;
a wafer stage adapted for holding a wafer positioned thereon; and
a gas delivery means for delivering a reactant gas into said chamber, said gas delivery means being positioned adjacent said top surface of said chamber, said region of highest ionization being located between said gas delivery means and at least one process gas outlet of said chamber, wherein substantially all of said reactant gas used in forming a process layer on said wafer is introduced into said plasma from above said plasma via said gas delivery means.

53. The deposition tool of claim 52, wherein said gas delivery means is comprised of a structure having at least one gas inlet and a plurality of gas outlets.

54. The deposition tool of claim 52, wherein reactant gas exiting said gas delivery means is directed so as to cover substantially all of an area defined by an upper surface of said wafer.

55. The deposition tool of claim 52, wherein said gas delivery means is comprised of a generally circular body having a diameter that is at least approximately the same as a diameter of said wafer, at least one inlet nozzle, and a plurality of outlet nozzles formed in a bottom surface of said generally circular body.

56. The deposition tool of claim 52, wherein said gas delivery means is comprised of a generally circular body and a plurality of outlet nozzles formed in a top surface of said body.

57. The deposition tool of claim 52, wherein said gas delivery means is comprised of a generally circular body and a plurality of outlet nozzles formed in a side surface of said body.

58. The deposition tool of claim 52, wherein said gas delivery means is comprised of a body having a plurality of angled outlets formed in an upper surface of said body.

59. The deposition tool of claim 58, wherein said angled openings are positioned at an angle of approximately 45 degrees with respect to said upper surface of said body.

60. The deposition tool of claim 52, wherein said gas delivery means is comprised of a manifold and a plurality of distribution pipes coupled to said manifold, each of said distribution pipes having a plurality of openings formed therein.

61. The deposition tool of claim 52, wherein said deposition tool is adapted to form a process layer to fill a plurality of trenches formed in said wafer.

62. The deposition tool of claim 52, further comprising an RF coil positioned adjacent a side surface of said chamber.

63. The deposition tool of claim 52, wherein said gas delivery means has a gas inlet that extends through said top surface of said chamber.

64. The deposition tool of claim 52, wherein said gas delivery means has an inlet that is coupled to said top surface of said chamber.

65. A deposition tool, comprising:
a process chamber having a top surface and an RF coil positioned adjacent said top surface;
a wafer stage adapted for holding a wafer positioned thereon; and
a gas delivery means for delivering a reactant gas into said chamber, said gas delivery means being positioned adjacent said top surface of said chamber, said gas delivery means being positioned above a position where a plasma will be generated in said chamber, wherein substantially all of said reactant gas is introduced into said plasma from above said plasma via said gas delivery means.

66. The deposition tool of claim 65, wherein said gas delivery means is comprised of a structure having at least one gas inlet and a plurality of gas outlets.

67. The deposition tool of claim 65, wherein reactant gas exiting said gas delivery means is directed so as to cover substantially all of an area defined by an upper surface of said wafer.

68. The deposition tool of claim 65, wherein said gas delivery means is comprised of a generally circular body having a diameter that is at least approximately the same as a diameter of said wafer, at least one inlet nozzle, and a plurality of outlet nozzles formed in a bottom surface of said generally circular body.

69. The deposition tool of claim 65, wherein said gas delivery means is comprised of a generally circular body and a plurality of outlet nozzles formed in a top surface of said body.

70. The deposition tool of claim 65, wherein said gas delivery means is comprised of a generally circular body and a plurality of outlet nozzles formed in a side surface of said body.

71. The deposition tool of claim 65, wherein said gas delivery means is comprised of a body having a plurality of angled outlets formed in an upper surface of said body.

72. The deposition tool of claim 71, wherein said angled openings are positioned at an angle of approximately 45 degrees with respect to said upper surface of said body.

73. The deposition tool of claim 65, wherein said gas delivery means is comprised of a manifold and a plurality of distribution pipes coupled to said manifold, each of said distribution pipes having a plurality of openings formed therein.

74. The deposition tool of claim 65, wherein said deposition tool is adapted to form a process layer to fill a plurality of trenches formed in said wafer.

75. The deposition tool of claim 65, further comprising an RF coil positioned adjacent a side surface of said chamber.

76. The deposition tool of claim 65, wherein said gas delivery means has a gas inlet that extends through said top surface of said chamber.

77. The deposition tool of claim 65, wherein said gas delivery means has an inlet that is coupled to said top surface of said chamber.

78. A deposition tool, comprising:
a process chamber, said chamber having a top surface and an RF coil positioned adjacent said top surface, said chamber adapted to have a plasma generated therein, said plasma having a region wherein highest ionization occurs;
a wafer stage adapted for holding a wafer positioned thereon; and
a gas delivery system positioned in said chamber adjacent said top surface, wherein said gas delivery system is comprised of a generally circular body and a plurality of outlet nozzles formed in a side surface of said body, said region of highest ionization of said plasma being located between said gas delivery system and at least one process gas outlet of said chamber, wherein substantially all of a reactant gas used in forming a process layer on said wafer is delivered into said chamber via said gas delivery system.

79. A deposition tool, comprising:
a process chamber, said chamber having a top surface and an RF coil positioned adjacent said top surface, said chamber adapted to have a plasma generated therein, said plasma having a region wherein highest ionization occurs;
a wafer stage adapted for holding a wafer positioned thereon; and
a gas delivery system positioned in said chamber adjacent said top surface, wherein said gas delivery system is comprised of a body having a plurality of angled outlets formed in an upper surface of said body, said region of highest ionization of said plasma being located between said gas delivery system and at least one process gas outlet of said chamber, wherein substantially all of a reactant gas used in forming a process layer on said wafer is delivered into said chamber via said gas delivery system.

80. The deposition tool of claim 79, wherein said angled openings are positioned at an angle of approximately 45 degrees with respect to said upper surface of said body.

81. A deposition tool, comprising:
a process chamber, said chamber having a top surface and an RF coil positioned adjacent said top surface, said chamber adapted to have a plasma generated therein, said plasma having a region wherein highest ionization occurs;
a wafer stage adapted for holding a wafer positioned thereon; and
a gas delivery system positioned in said chamber adjacent said top surface, wherein said gas delivery system is comprised of a manifold and a plurality of distribution pipes coupled to said manifold, each of said distribution pipes having a plurality of openings formed therein, said region of highest ionization of said plasma being located between said gas delivery system and at least one process gas outlet of said chamber, wherein substantially all of a reactant gas used in forming a process layer on said wafer is delivered into said chamber via said gas delivery system.

82. A deposition tool, comprising:
a process chamber, said chamber having a top surface and an RF coil positioned adjacent said top surface;
a wafer stage adapted for holding a wafer positioned thereon; and
a gas delivery system positioned in said chamber adjacent said top surface above a position where a plasma will be generated in said chamber, wherein substantially all of a reactant gas is delivered into said chamber via said gas delivery system, and wherein said gas delivery system is comprised of a generally circular body and a plurality of outlet nozzles formed in a side surface of said body.

83. A deposition tool, comprising:
a process chamber, said chamber having a top surface and an RF coil positioned adjacent said top surface;
a wafer stage adapted for holding a wafer positioned thereon; and
a gas delivery system positioned in said chamber adjacent said top surface above a position where a plasma will be generated in said chamber, wherein substantially all of a reactant gas is delivered into said chamber via said gas delivery system, and wherein said gas delivery system is comprised of a body having a plurality of angled outlets formed in an upper surface of said body.

84. The deposition tool of claim 83, wherein said angled openings are positioned at an angle of approximately 45 degrees with respect to said upper surface of said body.

85. A deposition tool, comprising:
a process chamber, said chamber having a top surface and an RF coil positioned adjacent said top surface;
a wafer stage adapted for holding a wafer positioned thereon; and
a gas delivery system positioned in said chamber adjacent said top surface above a position where a plasma will be generated in said chamber, wherein substantially all of a reactant gas is delivered into said chamber via said gas delivery system, and wherein said gas delivery system is comprised of a manifold and a plurality of distribution pipes coupled to said manifold, each of said distribution pipes having a plurality of openings formed therein.

86. A deposition tool, comprising:
a process chamber, said chamber having a top surface and an RF coil positioned adjacent said top surface;
a wafer stage adapted for holding a wafer positioned thereon; and
a gas delivery system positioned in said chamber adjacent said top surface above a position where a plasma will be generated in said chamber, wherein reactant gas exiting said gas delivery system is directed so as to cover substantially all of an area defined by an upper surface of said wafer, and wherein said gas delivery system is comprised of a generally circular body and a plurality of outlet nozzles formed in a side surface of said body.

87. The deposition tool of claim 86, wherein substantially all of a reactant gas is delivered into said chamber via said gas delivery system.

88. A deposition tool, comprising:
a process chamber, said chamber having a top surface and an RF coil positioned adjacent said top surface;
a wafer stage adapted for holding a wafer positioned thereon; and
a gas delivery system positioned in said chamber adjacent said top surface above a position where a plasma will be generated in said chamber, wherein reactant gas exiting said gas delivery system is directed so as to cover substantially all of an area defined by an upper surface of said wafer, and wherein said gas delivery system is comprised of a body having a plurality of angled outlets formed in an upper surface of said body.

89. The deposition tool of claim 88, wherein said angled openings are positioned at an angle of approximately 45 degrees with respect to said upper surface of said body.

90. The deposition tool of claim 88, wherein substantially all of a reactant gas is delivered into said chamber via said gas delivery system.

91. A deposition tool, comprising:
a process chamber, said chamber having a top surface and an RF coil positioned adjacent said top surface;
a wafer stage adapted for holding a wafer positioned thereon; and
a gas delivery system positioned in said chamber adjacent said top surface above a position where a plasma will be generated in said chamber, wherein reactant gas exiting said gas delivery system is directed so as to cover substantially all of an area defined by an upper surface of said wafer, and wherein said gas delivery system is comprised of a manifold and a plurality of distribution pipes coupled to said manifold, each of said distribution pipes having a plurality of openings formed therein.

92. The deposition tool of claim 91, wherein substantially all of a reactant gas is delivered into said chamber via said gas delivery system.

93. A deposition tool, comprising:
a process chamber having a top surface and an RF coil positioned adjacent said top surface, said chamber adapted to have a plasma generated therein, said plasma having a region wherein highest ionization occurs;
a wafer stage adapted for holding a wafer positioned thereon; and
a gas delivery means for delivering a reactant gas into said chamber, wherein said gas delivery means is comprised of a generally circular body and a plurality of outlet nozzles formed in a side surface of said body, said gas delivery means being positioned adjacent said top surface of said chamber, said region of highest ionization being located between said gas delivery means and at least one process gas outlet of said chamber, wherein substantially all of said reactant gas used in forming a process layer on said wafer is delivered into said chamber via said gas delivery means.

94. A deposition tool, comprising:
a process chamber having a top surface and an RF coil positioned adjacent said top surface, said chamber adapted to have a plasma generated therein, said plasma having a region wherein highest ionization occurs;
a wafer stage adapted for holding a wafer positioned thereon; and
a gas delivery means for delivering a reactant gas into said chamber, wherein said gas delivery means is comprised of a body having a plurality of angled outlets formed in an upper surface of said body, said gas delivery means being positioned adjacent said top surface of said chamber, said region of highest ionization being located between said gas delivery means and at least one process gas outlet of said chamber, wherein substantially all of said reactant gas used in forming a process layer on said wafer is delivered into said chamber via said gas delivery means.

95. The deposition tool of claim 94, wherein said angled openings are positioned at an angle of approximately 45 degrees with respect to said upper surface of said body.

96. A deposition tool, comprising:
a process chamber having a top surface and an RF coil positioned adjacent said top surface, said chamber adapted to have a plasma generated therein, said plasma having a region wherein highest ionization occurs;
a wafer stage adapted for holding a wafer positioned thereon; and
a gas delivery means for delivering a reactant gas into said chamber, wherein said gas delivery means is comprised of a manifold and a plurality of distribution pipes coupled to said manifold, each of said distribution pipes having a plurality of openings formed therein, said gas delivery means being positioned adjacent said top surface of said chamber, said region of highest ionization being located between said gas delivery means and at least one process gas outlet of said chamber, wherein substantially all of said reactant gas used in forming a process layer on said wafer is delivered into said chamber via said gas delivery means.

97. A deposition tool, comprising:
a process chamber having a top surface and an RF coil positioned adjacent said top surface;
a wafer stage adapted for holding a wafer positioned thereon; and
a gas delivery means for delivering a reactant gas into said chamber, wherein said gas delivery means is comprised of a generally circular body and a plurality of outlet nozzles formed in a side surface of said body, said gas delivery means being positioned adjacent said top surface of said chamber, said gas delivery means being positioned above a position where a plasma will be generated in said chamber, wherein substantially all of said reactant gas is delivered into said chamber via said gas delivery means.

98. A deposition tool, comprising:
a process chamber having a top surface and an RF coil positioned adjacent said top surface;
a wafer stage adapted for holding a wafer positioned thereon; and
a gas delivery means for delivering a reactant gas into said chamber, wherein said gas delivery means is comprised of a body having a plurality of angled outlets formed in an upper surface of said body, said gas delivery means being positioned adjacent said top surface of said chamber, said gas delivery means being positioned above a position where a plasma will be generated in said chamber, wherein substantially all of said reactant gas is delivered into said chamber via said gas delivery means.

99. The deposition tool of claim 98, wherein said angled openings are positioned at an angle of approximately 45 degrees with respect to said upper surface of said body.

100. A deposition tool, comprising:
a process chamber having a top surface and an RF coil positioned adjacent said top surface;
a wafer stage adapted for holding a wafer positioned thereon; and
a gas delivery means for delivering a reactant gas into said chamber, wherein said gas delivery means is comprised of a manifold and a plurality of distribution pipes coupled to said manifold, each of said distribution pipes having a plurality of openings formed therein, said gas delivery means being positioned adjacent said top surface of said chamber, said gas delivery means being positioned above a position where a plasma will be generated in said chamber, wherein substantially all of said reactant gas is delivered into said chamber via said gas delivery means.

101. A deposition tool, comprising:
a process chamber having a top surface and an RF coil positioned adjacent said top surface;
a wafer stage adapted for holding a wafer positioned thereon; and
a gas delivery means for delivering a reactant gas into said chamber such that said reactant gas covers substantially all of an area defined by an upper surface of said wafer, wherein said gas delivery means is comprised of a generally circular body and a plurality of outlet nozzles formed in a side surface of said body, said gas delivery means being positioned adjacent said top surface of said chamber above a position where a plasma will be generated in said chamber.

102. A deposition tool, comprising:
a process chamber having a top surface and an RF coil positioned adjacent said top surface;

a wafer stage adapted for holding a wafer positioned thereon; and a gas delivery means for delivering a reactant gas into said chamber such that said reactant gas covers substantially all of an area defined by an upper surface of said wafer, wherein said gas delivery means is comprised of a body having a plurality of angled outlets formed in an upper surface of said body, said gas delivery means being positioned adjacent said top surface of said chamber above a position where a plasma will be generated in said chamber.

103. The deposition tool of claim 102, wherein said angled openings are positioned at an angle of approximately 45 degrees with respect to said upper surface of said body.

104. A deposition tool, comprising:

a process chamber having a top surface and an RF coil positioned adjacent said top surface;

a wafer stage adapted for holding a wafer positioned thereon; and a gas delivery means for delivering a reactant gas into said chamber such that said reactant gas covers substantially all of an area defined by an upper surface of said wafer, wherein said gas delivery means is comprised of a manifold and a plurality of distribution pipes coupled to said manifold, each of said distribution pipes having a plurality of openings formed therein, said gas delivery means being positioned adjacent said top surface of said chamber above a position where a plasma will be generated in said chamber.

105. A deposition tool, comprising:

a process chamber having a top surface and an RF coil positioned adjacent said top surface;

a wafer stage adapted for holding a wafer positioned thereon; and a gas delivery means for delivering a reactant gas into said chamber such that said reactant gas covers substantially all of an area defined by an upper surface of said wafer, wherein said gas delivery means is adapted to introduce substantially all of said reactant gas into said plasma from above said plasma, said gas delivery means being positioned adjacent said top surface of said chamber above a position where a plasma will be generated in said chamber.

106. A deposition tool, comprising:

a process chamber, said chamber having a top surface and an RF coil positioned adjacent said top surface, said chamber adapted to have a plasma generated therein, said plasma having a region wherein highest ionization occurs;

a wafer stage adapted for holding a wafer positioned thereon; and a gas delivery system positioned in said chamber adjacent said top surface, said region of highest ionization of said plasma being located between said gas delivery system and at least one process gas outlet of said chamber, wherein substantially all of a reactant gas used in forming a process layer on said wafer is delivered into said chamber via said gas delivery system, and wherein said reactant gas exiting said gas delivery system is directed toward said top surface of said process chamber.

107. The deposition tool of claim 106, wherein said gas delivery system is comprised of a generally circular body and a plurality of outlet nozzles formed in a top surface of said body.

108. A deposition tool, comprising:

a process chamber, said chamber having a top surface and an RF coil positioned adjacent said top surface;

a wafer stage adapted for holding a wafer positioned thereon; and a gas delivery system positioned in said chamber adjacent said top surface above a position where a plasma will be generated in said chamber, wherein substantially all of a reactant gas is delivered into said chamber via said gas delivery system, and wherein said reactant gas exiting said gas delivery system is directed toward said top surface of said process chamber.

109. The deposition tool of claim 108, wherein said gas delivery system is comprised of a generally circular body and a plurality of outlet nozzles formed in a top surface of said body.

110. A deposition tool, comprising:

a process chamber, said chamber having a top surface and an RF coil positioned adjacent said top surface;

a wafer stage adapted for holding a wafer positioned thereon; and a gas delivery system positioned in said chamber adjacent said top surface above a position where a plasma will be generated in said chamber, wherein reactant gas exiting said gas delivery system is directed so as to cover substantially all of an area defined by an upper surface of said wafer, and wherein said reactant gas exiting said gas delivery system is directed toward said top surface of said process chamber.

111. The deposition tool of claim 110, wherein said gas delivery system is comprised of a generally circular body and a plurality of outlet nozzles formed in a top surface of said body.

112. A deposition tool, comprising:

a process chamber, said chamber having a top surface and an RF coil positioned adjacent said top surface;

a wafer stage adapted for holding a wafer positioned thereon; and a gas delivery system positioned in said chamber adjacent said top surface above a position where a plasma will be generated in said chamber, wherein substantially all of a reactant gas is delivered into said chamber via said gas delivery system, and wherein reactant gas exiting said gas delivery system is directed so as to cover substantially all of an area defined by an upper surface of said wafer, and wherein said reactant gas exiting said gas delivery system is directed toward said top surface of said process chamber.

113. The deposition tool of claim 112, wherein said gas delivery system is comprised of a generally circular body and a plurality of outlet nozzles formed in a top surface of said body.

* * * * *